(12) United States Patent
Reber et al.

(10) Patent No.: US 10,508,365 B2
(45) Date of Patent: Dec. 17, 2019

(54) METHOD AND DEVICE FOR PRODUCING A SEMICONDUCTOR LAYER

(71) Applicant: NexWafe GmbH, Freiburg (DE)

(72) Inventors: Stefan Reber, Gundelfingen (DE); Kai Schillinger, Freiburg (DE); Frank Siebke, Merzhausen (DE)

(73) Assignee: NexWafe GmbH, Freiburg (DE)

( * ) Notice: Subject to any disclaimer, the term of this patent is extended or adjusted under 35 U.S.C. 154(b) by 0 days.

(21) Appl. No.: 15/769,912

(22) PCT Filed: Sep. 27, 2016

(86) PCT No.: PCT/EP2016/072970
§ 371 (c)(1),
(2) Date: Apr. 20, 2018

(87) PCT Pub. No.: WO2017/067758
PCT Pub. Date: Apr. 27, 2017

(65) Prior Publication Data
US 2018/0305839 A1    Oct. 25, 2018

(30) Foreign Application Priority Data
Oct. 22, 2015   (DE) .................. 10 2015 118 042

(51) Int. Cl.
*H01L 21/02*     (2006.01)
*H01L 21/683*    (2006.01)
(Continued)

(52) U.S. Cl.
CPC .............. *C30B 33/02* (2013.01); *C30B 25/18* (2013.01); *C30B 29/06* (2013.01); *C30B 33/06* (2013.01);
(Continued)

(58) Field of Classification Search
CPC .................... H01L 21/76251–21/76259; H01L 21/7806–21/7813; H01L 31/1892–31/1896
See application file for complete search history.

(56) References Cited

U.S. PATENT DOCUMENTS 5,934,973 A    8/1999   Boucher et al.
6,252,227 B1   6/2001   Tseng et al.
(Continued)

FOREIGN PATENT DOCUMENTS

DE    102014107557   12/2014
DE    102013219839    4/2015
(Continued)

OTHER PUBLICATIONS

Kajari-Schroder et al., "Lift-off of free-standing layers in the kerfless porous silicon process", Energy Procedia, www.sciencedirect.com, vol. 38, pp. 919-925, Jul. 2013.

*Primary Examiner* — Daniel P Shook
(74) *Attorney, Agent, or Firm* — Volpe and Koenig, P.C.

(57) ABSTRACT

A method for producing a semiconductor layer (3), including the following method steps: A creating a release layer (2) on a carrier substrate (1); B applying a semiconductor layer (3) to the release layer (2); C detaching the semiconductor layer (3) from the carrier substrate. The invention is characterized in that, in method step A, the release layer (2) is created so as to fully cover at least a processing side of the carrier substrate, in that, in method step B, the semiconductor layer (3) is applied so as to fully cover the release layer (2) at least on the processing side and partially overlap one or more peripheral sides (5a, 5b) of the carrier substrate and in that, between method steps B and C, in a method step C0, regions of the semiconductor layer (3) that overlap a peripheral side are removed. The invention also relates to a (Continued)

semiconductor wafer, to a device for edge correction, to a detaching unit and to a device for producing a semiconductor layer.

14 Claims, 6 Drawing Sheets

(51) Int. Cl.
  *C30B 33/02* (2006.01)
  *C30B 33/06* (2006.01)
  *C30B 25/18* (2006.01)
  *C30B 29/06* (2006.01)

(52) U.S. Cl.
  CPC .. *H01L 21/02381* (2013.01); *H01L 21/02532* (2013.01); *H01L 21/6835* (2013.01)

(56) References Cited

U.S. PATENT DOCUMENTS

| | | | |
|---|---|---|---|
| 6,881,131 | B2 | 4/2005 | Parsells et al. |
| 7,442,255 | B2 | 10/2008 | Einhaus et al. |
| 9,293,371 | B2 | 3/2016 | Reitmeier et al. |
| 9,399,818 | B2 | 7/2016 | Reber et al. |
| 2003/0008478 | A1* | 1/2003 | Abe ............... B24B 9/065 438/459 |
| 2004/0026382 | A1 | 2/2004 | Richerzhagen |
| 2004/0206444 | A1* | 10/2004 | Letertre ......... H01L 21/76254 156/182 |
| 2007/0072393 | A1 | 3/2007 | Aspar et al. |
| 2007/0148917 | A1 | 6/2007 | Morita et al. |
| 2008/0217311 | A1 | 9/2008 | Berhardt et al. |
| 2011/0140244 | A1 | 6/2011 | Schwarzenbach et al. |
| 2016/0211154 | A1 | 6/2016 | Reber et al. |

FOREIGN PATENT DOCUMENTS

| | | |
|---|---|---|
| DE | 102013219886 | 4/2015 |
| EP | 1613795 | 1/2007 |
| EP | 2333815 | 6/2011 |
| EP | 0797258 | 7/2011 |
| FR | 2860842 | 4/2005 |
| JP | 2000348992 | 12/2000 |
| WO | 0207927 | 1/2002 |
| WO | 2013004851 | 1/2013 |

* cited by examiner

METHOD AND DEVICE FOR PRODUCING A SEMICONDUCTOR LAYER

BACKGROUND

The invention relates to a device and a method for producing a semiconductor layer.

For large-area electronic components such as, for example, large-area illuminants or photovoltaic solar cells, there is a need for cost-effective semiconductor wafers having high electronic quality since, in the case of such components, the material costs of the semiconductor wafer constitute a significant proportion of the costs of the overall product. In order to produce semiconductor wafers, methods are known wherein semiconductor wafers are produced from silicon blocks ("ingots") by means of sawing methods. High-quality, in particular monocrystalline, semiconductor wafers can be produced by this means. However, the production costs are high, also due to the loss of material during the sawing of the silicon blocks.

Alternative methods were developed, therefore, in which a semiconductor layer is deposited on a carrier substrate and subsequently detached from the carrier substrate. The detached semiconductor layer thus constitutes the semiconductor wafer for producing the electronic component.

Various optimizations were implemented for such methods for producing a semiconductor layer; in this regard, in WO 2013/004851 A1, the area of potential parasitic depositions during the coating process was minimized.

However, a further reduction of costs is necessary for industrial use.

SUMMARY

Therefore, the present invention is based on the object of achieving a reduction of costs in the previously known method for producing a semiconductor layer.

This object is achieved by a method for producing a semiconductor layer, by a semiconductor wafer, by a device for the edge side correction of a coated carrier substrate during the production of a semiconductor layer, by a detaching unit for detaching a semiconductor layer from a carrier substrate, and by a device for producing a semiconductor layer having one or more features of the invention. Advantageous configurations of the method and an advantageous configuration of the device for edge side correction are described below and in the claims.

The method according to the invention for producing a semiconductor layer comprises the following method steps:

A method step A involves producing a separating layer at a carrier substrate. A method step B involves applying a semiconductor layer on the separating layer. A method step C involves detaching the semiconductor layer from the carrier substrate.

These method steps are known per se from the prior art. The semiconductor layer detached in method step C is typically used—as described in the introduction—as a semiconductor wafer for producing an electronic component, in particular for producing a photovoltaic solar cell.

The present invention is based on the insight that a plurality of effects impair the quality and reusability of the carrier substrate, with the result that, due to a frequently required exchange of the carrier substrate, higher costs arise and/or the reduced quality of the carrier substrate impairs the quality of the semiconductor layer produced, with the result that higher production costs likewise arise vis à vis a ratio of quality of the semiconductor layer produced to process costs. Investigations by the applicant have revealed that this is based in particular on the following problems:

If the separating layer is not formed over the whole area, at a processing side of the carrier substrate, the separating layer being arranged at said processing side, a non-detachable edge of the semiconductor layer remains on the substrate. In this edge region the semiconductor layer covers the carrier substrate directly, without the interposition of the separating layer. Each time the carrier substrate is reused, the thickness of this edge region increases, thus giving rise to a step which impairs the process, reduces the number of possible reuses of the carrier substrate and is disadvantageous for the homogeneity of the detached semiconductor layer produced.

As a result of material deposition at edge sides of the carrier substrate, the lateral dimension of the substrate increases during each coating process. Particularly the deposition of semiconductor material in method step B at the edge sides leads to non-releasable deposits or deposits that are releasable only with difficulty. Exact handling of the carrier substrate is made considerably more difficult, however, if the lateral extent of the carrier substrate is non-uniform and depends in particular on the number of coating processes that have already proceeded. Furthermore, the deposits at edge sides of the carrier substrate can result in shading effects during the coating or incorrect positions during the positioning of the carrier substrate, with the result that this can also impair the homogeneity and thus the quality of the semiconductor layer produced.

These adverse effects thus increase the risk of inhomogeneous semiconductor layers being deposited and/or the number of possible reuses of the carrier substrate being reduced and/or the carrier substrate needing to be reworked in a complex manner. The production costs thus increase overall as a result.

What is essential to the method according to the invention is that in method step A the separating layer is produced in a manner covering at least a processing side of the carrier substrate over the whole area. What is thus made possible as a result is that no direct contact is made between semiconductor layer and carrier substrate during the process of applying the semiconductor layer even at edge regions of the processing side, with the result that coated edge regions that are detachable with difficulty are avoided. In this case, it lies within the scope of the invention for the separating layer to be applied as a separate layer on the carrier substrate. It likewise lies within the scope of the invention for the separating layer to be formed at least partly, preferably completely, in the material of the carrier substrate, for example by porosification of the carrier substrate at the processing side. In both cases, in the method according to the invention, the separating layer is formed in a manner covering the processing side over the whole area.

Accordingly, in method step B the semiconductor layer is applied in a manner covering the separating layer at least at the processing side over the whole area. This achieves, in particular, an efficient utilization of the whole area of the carrier substrate at the processing side.

Furthermore, it is essential that in method step B the semiconductor layer is applied in a manner at least partly overlapping one or more edge sides of the carrier substrate. Investigations by the applicant have shown that this ensures an embodiment of the semiconductor layer which covers the processing side over the whole area. Although it is inherently desirable to deposit the semiconductor layer in such a way that the edges of the deposited semiconductor layer correspond exactly to the edges of the carrier substrate and the separating layer applied thereon, such a configuration, in terms of process engineering, is very complex and thus cost-intensive and/or susceptible to faults.

The method according to the invention therefore provides, as a configuration which is insusceptible to faults and is thus also cost-effective, in method step B, the process of applying the semiconductor layer in a manner at least partly overlapping the edge sides of the carrier substrate. This ensures that the semiconductor layer is applied over the whole area at the processing side.

Furthermore, it is essential that between method steps B and C, in a method step C0, regions of the semiconductor layer which overlap an edge side are removed.

In method step C0, therefore, a kind of "edge definition" of the carrier substrate is effected by the semiconductor layer being removed again at the edge sides of the carrier substrate. As a result, after method step C0 has been carried out, a semiconductor layer thus remains which preferably corresponds vis à vis its lateral extent to the original dimensions of the carrier substrate within the technically permissible tolerances in terms of process engineering before the coating process. The technically permissible tolerances are typically in the range of a few μm. Preferably, the lateral extent therefore changes by less than 20 μm, in particular by less than 10 μm, more preferably by less than 5 μm. Typically, a reduction of the thickness and/or of the lateral extent by a few μm, in particular by approximately 1 μm to 5 μm, takes place during multiple use of a carrier substrate. Since standardized lateral extents for semiconductor wafers in the field of photovoltaics typically have a tolerance of approximately 1000 μm, a change as described above can be afforded tolerance even when a carrier substrate is reused a multiplicity of times.

After the semiconductor layer has been detached in method step C, a carrier substrate thus remains which firstly has no residues of the semiconductor layer at the processing side. This stems from the fact that the separating layer is produced in a manner covering the processing side of the carrier substrate over the whole area. Furthermore, the carrier substrate has the original lateral dimensions within the technically permissible tolerances in terms of process engineering. This stems from the fact that in method step C0 regions of the semiconductor layer which overlap an edge side are removed.

The method according to the invention thus avoids the disadvantages mentioned in the introduction which impair the homogeneity of the semiconductor layer and/or reduce the number of possible reuses of the carrier substrate. A more cost-effective production process is thereby achieved as a result.

These advantages are achieved in particular in one advantageous configuration of the method according to the invention in which in method step B the semiconductor layer is applied in a manner at least partly overlapping the edge sides circumferentially at all edge sides of the carrier substrate. Preferably, the semiconductor layer is thus applied in such a way that all edges of the carrier substrate at the processing side, in particular circumferentially all edges of the carrier substrate, are overlapped by the semiconductor layer. In this case, it lies within the scope of the invention for the semiconductor layer to extend as far as an edge of the carrier substrate at a rear side of the carrier substrate opposite the processing side. It is advantageous, however, for the semiconductor layer to extend only over a partial section between an edge at the processing side and an edge at the rear side and thus to be applied in a manner only partly overlapping the edge side of the carrier substrate. This prevents overlapping of the edges at the rear side of the carrier substrate and thus application of the semiconductor layer at the rear side of the carrier substrate and impairment of the rear side of the carrier substrate.

A further increase in the insusceptibility to faults and thus in the robustness of the method is achieved in one preferred embodiment wherein in method step A the separating layer is produced in a manner at least partly overlapping and extending along one or more edge sides (5a, 5b) of the carrier substrate, in particular in a manner overlapping the edge side, preferably, and wherein after method step B, preferably in method step C0, at least regions of the separating layer which overlap an edge side are removed.

Even at the edge sides, in the case of this advantageous embodiment it thus lies within the scope of the invention for the separating layer to be applied on the edge sides of the carrier substrate. Likewise, it is possible to form the separating layer at the edge sides at least partly, preferably completely, in the carrier substrate, for example by porosification.

After method step B, in particular before method step C and preferably in method step C0, at least regions of the separating layer which overlap an edge side are removed. Consequently—within the technical tolerance limits—at least such regions of the separating layer which project beyond the original lateral extent of the carrier substrate are removed. In this case as well—within the technical tolerance limits—more extensive removal at the edge sides in the range of a few μm may be unavoidable, particularly if, at the edge sides, the separating layer was formed by porosification of the carrier substrate and this carrier substrate region near the edge and having a thickness of a few μm is thus mechanically comparatively unstable.

In the case of this advantageous embodiment, the insusceptibility to faults is thus increased further by virtue of the fact that the separating layer also envelops at least the edges of the carrier substrate at the processing side, with the result that a whole-area embodiment of the separating layer is ensured.

In this case, it lies within the scope of the invention for the semiconductor layer to cover the edge sides of the carrier substrate only indirectly, i.e. for the separating layer always to be arranged between carrier substrate and semiconductor layer at the edge sides. It likewise lies within the scope of the invention for the semiconductor layer, at the edge sides, to extend further toward the rear side of the carrier substrate than the separating layer, such that in a first region at the edge sides, which adjoins the edges of the processing side, the semiconductor layer covers the carrier substrate at the edge sides indirectly—with the interposition of the separating layer—and in a second region, which is further away from the processing side by comparison therewith, the semiconductor layer covers the edge sides of the carrier substrate directly—without the interposition of the separating layer.

Essential aspects of the present invention are thus that a whole-area embodiment of the separating layer at the processing side and whole-area application of the semiconductor layer at the processing side are ensured and that material depositing at the edge sides of the carrier substrate is removed again before the semiconductor layer is detached. This material comprises the regions of the semiconductor layer which overlap the edge sides and, if appropriate, the regions of the separating layer which likewise overlap the edge sides of the carrier substrate.

Multiple uses of the carrier substrate are possible as a result. In one advantageous embodiment, therefore, the method according to the invention is carried out multiple times with the same carrier substrate being reused. In particular, in this way the carrier substrate can be used more than 10 times, in particular more than 25 times, in particular more than 50 times.

As described above, in method step B the semiconductor layer is thus preferably applied in a manner at least partly and preferably completely covering the separating layer at the edge sides. In particular, it is advantageous for the semiconductor layer to be additionally applied in a manner directly covering the semiconductor substrate at least partly at the edge sides.

Preferably, removing the material in the edge sides of the carrier substrate, thus at least removing the semiconductor layer at the edge sides, if appropriate additionally removing the separating layer at the edge sides, is carried out by means of one or more of the following methods/devices:

- removing by laser radiation (as described e.g. in WO 2002007927 A1);
- water jet cutting (as described e.g. in US20040026382);
- thermal-shock-induced breaking methods (as described e.g. in US20080217311);

What is particularly advantageous here is the combination of a heating process, followed by a cooling process, in particular heating up by a laser followed by a cooling-down process by a liquid, in particular by a water jet cooler;

- diamond blade wafer saw (as described e.g. in U.S. Pat. No. 5,934,973);
- wire saw, in particular having fixed or loose abrasive grains (as described e.g. in U.S. Pat. No. 6,881,131);
- milling device;
- plasma cutting (as described e.g. in DE102014107557A1);
- ion beam cutting (as described e.g. in U.S. Pat. No. 6,252,227B1).

When removing the material which overlaps the edge side, it lies within the scope of the invention for a cut to be made along the edge sides of the carrier substrate, with the result that the excess material is removed. It is particularly advantageous for the material to be removed at the edge sides to be completely removed by machining, ablated, evaporated and/or melted during the removing process. In this preferred embodiment, therefore, no residual fragments remain during the removal of material at the edge sides, rather the material is completely comminuted, evaporated and/or melted during the removal process, with the result that transport away, in particular, is possible in a simple manner; for example by extraction by suction. Furthermore, the complete removal reduces the risk of partly separated broken fragments breaking off over a large area at the edge sides and broken edges thereby arising at the processing side, too, which thus extend within the area of the later semiconductor wafer.

The shape of the carrier substrate depends in particular on the desired shape of the semiconductor layer. Typical semiconductor wafers have at least four main edges, which extend in pairs, parallel to one. In particular, rectangular, square and polygonal wafers having a plurality of pairs of edges extending parallel to one another are known. One typical wafer shape here is an octagon, which arises geometrically by beveling the four corners of a square or rectangle and is also referred to as "pseudo-square" or "pseudo-rectangular".

In method step C0, preferably at all edge sides regions of the semiconductor layer and, if appropriate, of the separating layer which overlap the respective edge side are removed. In particular, it is cost-effective in method step C0 to remove material simultaneously at at least one pair of edge sides extending parallel, preferably to remove material for each pair of parallel edge sides in each case simultaneously at both edge sides.

Typical carrier substrates have a rectangular processing side, in particular a parallelepipedal shape, and hence two pairs of edge sides extending parallel. Preferably, in this case, in method step C0, in a method step C0a, removing is carried out simultaneously at two mutually opposite edge sides of the carrier substrate. Furthermore, preferably, in an indirectly or directly succeeding method step C0b, removing is carried out simultaneously at the other two opposite edge sides of the carrier substrate.

By this means, removing the material at the edge sides of the carrier substrate is thus achieved effectively and in particular with a short processing time. In particular, it is advantageous for rotating the carrier substrate by 90° about an axis perpendicular to the processing side to be carried out between method steps C0a and C0b. In this advantageous embodiment, in line processing is thus possible by virtue of the fact that, at a first processing station, removing is carried out simultaneously at the first pair of mutually opposite edge sides, then rotating the carrier substrate by 90° is carried out as described above, furthermore followed by removing the material at the second pair of mutually opposite edge sides. As a result, the removing can be carried out in each case at edge sides which extend parallel to a progression direction of the carrier substrate in the in line process. In particular, in an advantageous configuration, removing can thus be carried out by means of in each case two stationary removing units, while the carrier substrate is moved relative to the two removing units, each of which respectively removes the material at an edge side.

The rectangular substrate and the semiconductor layer furthermore advantageously have a basic area that is square within the permissible tolerances. The rectangular or square substrate likewise advantageously has chamfers at the corners. Besides method steps C0a and C0b described, this results in a further method step C0c, which if appropriate consists of two steps C0c1 and C0c2 and lies between or indirectly or directly follows said method steps and in which removing for the purpose of producing the chamfers is carried out simultaneously or successively.

In particular, it is advantageous for the carrier substrate to be rotated twice by firstly 45° and then 90° about an axis perpendicular to the processing side between method steps C0b and C0c1. In this advantageous embodiment, therefore, in line processing is possible by virtue of the fact that, at a first processing station, removing is carried out simultaneously at the first pair of mutually opposite edge sides, then rotating the carrier substrate by 90° is carried out as described above, furthermore followed by removing the material at the second pair of mutually opposite edge sides, then rotating the carrier substrate by 45° is carried out as described, furthermore followed by removing the material at a third pair of mutually opposite edge sides (C0c1), then rotating the carrier substrate by 90° is carried out as described, furthermore followed by removing the material at a fourth pair of mutually opposite edge sides (C0c2).

Furthermore, it is advantageous if method steps C0a, C0b, C0c1 and C0c2 are carried out in the order C0a, C0c1, C0b, C0c2 with respectively intervening rotation of the carrier substrate by 45° in each case. It is furthermore advantageous if method step C0c is carried out in one step without prior rotation of the substrate by four or more fixedly installed tools or by one tool that is freely rotatable about an axis perpendicular to the processing side.

Furthermore, it is advantageous if the substrate is at rest during method step C and a tool carries out the removal along the desired end shape of the substrate and the semiconductor layer in a trajectory that is fixedly predefined beforehand. This method enables arbitrary shapes of the substrate, for example circular shapes having in particular, flattened portions and/or indentations and/or profiled edges of the substrate and/or of the semiconductor layer.

One advantageous method for removing the edges in method step C in particular for the purpose of producing arbitrary shapes is furthermore carried out using uniaxially or multiaxially movable feed units for the substrate, which feed the substrate to one or more tools and in this case process the entire trajectory of the edge side.

Producing the separating layer at the carrier substrate in method step A and applying the semiconductor layer on the separating layer and at least partly indirectly or directly at the edge sides of the carrier substrate in method step B can be carried out, in principle, in a manner known per se.

By way of example, it is known from EP 1 613 795 B1 that a separating layer for separating a semiconductor layer from the coated medium is produced by applying a powder coating composed of silicon nitride. In this case, the powder layer is stirred as a suspension, applied using typical methods from lacquering technology, e.g. spray coating, dried and fired.

It is known from EP 0 797 258 B1 that a separating layer for separating a silicon layer from a silicon substrate can be produced by electrochemically etching a multilayer composed of porous silicon. In this case, the substrate in an electrolyte containing hydrofluoric acid is exposed to an etching current of varying current intensity such that a multilayer composed of individual layers of high and low porosity arises. This multilayer forms a mechanically weak layer which, after method step B has been carried out, enables the semiconductor layer to be detached in method step C.

Detaching the semiconductor layer in method step C can likewise be carried out in a manner known per se, for example as described in Kajari-Schröder (Sarah Kajari-Schröder, Jörg Käsewieter, Jan Hensen, Rolf Brendel, Lift-off of Free-standing Layers in the Kerfless Porous Silicon Process, Energy Procedia, Volume 38, 2013, pages 919-925): accordingly, a 30-50 μm thick silicon layer is pulled off by a vacuum chuck with 0.2 bar vacuum. In this case, firstly the substrate is fixed in a suitable manner. Afterward, a vacuum chuck provided with a radius is guided in a rolling movement over the surface of the semiconductor layer and the semiconductor layer is fixed to the chuck by a vacuum being applied. As a result of the rolling movement, a pulling-off force is exerted on the semiconductor layer which breaks residual adhesion sites and thus separates the semiconductor layer from the substrate.

Furthermore, in particular the semiconductor layer at the opposite side relative to the separating layer, over a large area, can be sucked by vacuum onto a detaching element such as, for example, large-area vacuum tweezers, with the result that the semiconductor layer is removed from the carrier substrate by force action.

In one advantageous embodiment, in method step C the detaching is supported by a prior shearing movement, or shearing movement carried out simultaneously with a pulling-off movement of the semiconductor layer, with a rotation angle of between 0.001° and 10°, preferably 0.01° and 1°, particularly preferably 0.1° and 0.5°. This fosters the detaching process in the region of the separating layer between semiconductor layer and carrier substrate.

In a further advantageous configuration, between method steps B and C, preferably between method steps C0 and C, the separating layer is weakened by mechanical stress loading or a so-called "chemical attack". Such a stress loading can be carried out by mechanically moving the semiconductor layer relative to the carrier substrate in a movement direction parallel to the processing side, wherein the movement is preferably carried out over a distance in the range of 10 μm to 1000 μm. The mechanical stress loading can likewise be carried out by ultrasound being applied to the separating layer and/or by applying a temperature stress between semiconductor layer and carrier substrate by different temperatures being applied via the holding devices. This can advantageously be carried out by forming a spatial temperature gradient at least in the separating layer, preferably a temperature difference in the range of 30 K to 500 K, preferably in the range of 100 K to 200 K, between the side facing the semiconductor layer and the side of the separating layer facing the carrier substrate.

Alternatively and/or additionally, a chemical attack can be carried out by a wet-chemical etchant by virtue of a liquid that etches the semiconductor or a corresponding gas being introduced into the separating layer.

It likewise lies within the scope of the invention to implement a combination of the methods mentioned above. By applying one or more of the methods mentioned above, the separating layer is weakened, such that there is a weaker mechanical connection between carrier substrate and semiconductor layer and simpler detachment and in particular a low risk of breaking of the semiconductor layer during detachment are thus achieved.

The majority of the large-area semiconductor components produced at the present time are based on silicon wafers. Preferably, therefore, the semiconductor layer is embodied as a silicon layer. In particular, it is advantageous for the semiconductor layer to be embodied as a monocrystalline silicon layer, preferably having a doping in the range of $1\times10^{14}$ cm$^{-3}$ to $1\times10^{20}$ cm$^{-3}$, particularly preferably between $5\times10^{14}$ cm$^{-3}$ and $1\times10^{16}$ cm$^{-3}$. This is based on the fact that highly efficient photovoltaic solar cells are producible with such a doping. An n-type doping with phosphorus atoms is preferably produced, likewise preferably a p-type doping with boron atoms can be produced. In one advantageous embodiment, a layer stack comprising p-type and n-type regions e.g. for forming at least one pn junction is produced in method step B.

The carrier substrate can be embodied in a manner known per se and be in particular n-doped or p-doped. In particular, it is advantageous for the carrier substrate used to be a semiconductor substrate, in particular a silicon substrate, preferably a p-doped silicon substrate, preferably having a doping of greater than $1\times10^{16}$ cm$^{-3}$, in particular in the range of $1\times10^{17}$ cm$^{-3}$ to $5\times10^{19}$ cm$^{-3}$, in particular in the range of $1\times10^{18}$ cm$^{-3}$ to $1\times10^{19}$ cm$^{-3}$. This has the advantage that a variable porosity can be produced in the silicon wafer by wet-chemical etching, in particular by electrochemical wet-chemical etching.

The separating layer is preferably embodied as a porous layer in a manner known per se. In particular, for the purpose of producing the separating layer, the carrier substrate is advantageously porosified in a manner known per se, in particular by an etching process, as described for example in DE 102013219839.

Alternatively, the separating layer can be embodied as a mechanically weak powder layer, e.g. by silicon nitride powder, graphite powder or quartz powder being applied on the surface of the substrate by spraying, clipping, in the sol-gel method or further known methods and, if appropriate, being stabilized e.g. by a thermal treatment.

Investigations by the applicant have shown that robust handling that is insusceptible to faults is effected, in particular, by virtue of the separating layer having a thickness in the range of 0.1 μm to 100 μm, in particular in the range of 0.5 μm to 50 μm, preferably in the range of 0.8 μm to 5 μm.

The carrier substrate preferably has a thickness in the range of 50 μm to 5000 μm, in particular 150 μm to 1000 μm, more preferably 400 μm to 800 μm. The thickness of the semiconductor layer primarily depends on the desired thickness of the semiconductor wafer for producing the electronic component. Preferably, the thickness of the semiconductor layer is in the range of 10 μm to 500 μm, in particular in the range of 60 μm to 180 μm. For producing photovoltaic solar cells, semiconductor wafers having a thickness of approximately 150 μm are often used, such that the thickness of the semiconductor layer is also chosen accordingly in the case of this intended use.

The present invention furthermore relates to a semiconductor wafer which is produced by means of the method according to the invention, in particular one advantageous embodiment thereof. As described above, the detached semiconductor layer constitutes the semiconductor wafer.

As described above, a particularly efficient and time-saving removal of the material at the edge sides of the carrier substrate results by virtue of the material being removed simultaneously at two opposite sides of the carrier substrate. The invention therefore furthermore relates to a device for the edge side correction of a coated carrier substrate during the production of a semiconductor layer and in particular the use of such a device for edge side correction during the production of a semiconductor layer by means of a method according to the invention, in particular one preferred embodiment thereof. The device comprises a removing apparatus for removing material at at least one edge side of the carrier substrate. Such devices are known for edge definition in the process for producing solar cells.

What is essential is that the removing apparatus is configured at two opposite edge sides of the carrier substrate, which are arranged at a distance from one another and with a parallel, preferably identical, rotation axis. In this case, the distance between the two saw blades corresponds to the distance between the two assigned edge sides of the carrier substrate, i.e. the width of the carrier substrate with respect to these two edge sides before separating layer and semiconductor layer are produced. In this advantageous configuration, therefore, removing material at the two opposite edge sides can be carried out by simply passing the carrier substrate through between the two saw blades. By rotating the carrier substrate by 90° and then pushing it through again, it is accordingly possible for removing to be carried out at the other two opposite edge sides. If the carrier substrate does not have a square basic area, for this purpose between the two removal processes the distance between the removal devices is adapted to the respective width for this removal process. It is particularly advantageous for the device to comprise in addition to the aforementioned removing apparatus as first removing apparatus a second removing apparatus and a rotating device. The second removing apparatus is configured to remove material at two opposite sides of the carrier substrate, in particular at exactly two opposite sides of the carrier substrate, and the rotating device is configured to rotate the carrier substrate about an axis parallel to at least one edge side of the carrier substrate, in particular by 90°. The rotating device is arranged in a processing sequence direction between the first and second removing apparatuses.

In this advantageous embodiment, an in line process is thus possible: firstly, the material is removed at the first pair of mutually opposite edge sides by the first removing apparatus. The carrier substrate is then rotated by 90° and the material at the second pair of mutually opposite edge sides of the carrier substrate is then in turn removed in the second removing apparatus, preferably likewise by the carrier substrate being pushed through between two removing units, in particular wafer saws.

The device according to the invention for edge side correction is preferably configured for carrying out the method according to the invention, in particular one advantageous embodiment thereof.

A cost saving is furthermore achieved by a detaching unit for detaching a semiconductor layer from a carrier substrate. The invention therefore furthermore relates to such a detaching unit and in particular the use of such a detaching unit during the production of a semiconductor layer by a method according to the invention, in particular one preferred embodiment thereof. The detaching unit comprises one or more of the following:

- at least two gripping units, in particular vacuum gripping units, comprising a first gripping unit for gripping the carrier substrate and a second gripping unit for gripping the semiconductor layer, wherein preferably one or both gripping units enable(s) a bending of the substrate,
- a rotating device in order to bring about a relative rotation between semiconductor layer and carrier substrate, in particular about an axis perpendicular to the semiconductor layer,
- an ultrasonic device in order to apply ultrasound to a separating layer arranged between semiconductor layer and carrier substrate,
- a thermal shock unit in order to apply a thermal shock to a separating layer arranged between semiconductor layer and carrier substrate,
- a tilting device in order to produce a relative movement between semiconductor layer and carrier substrate about a pivot at an edge of the carrier substrate or preferably a remote pivot, and also a movement apparatus for tilting or bending the gripping units (11a or 11b) around an edge of the semiconductor layer or a remote pivot, by an angle of between 0.05° and 45°, preferably between 0.1° and 5°,
- an etching unit in order to subject a separating layer arranged between semiconductor layer and carrier substrate at least partly to etching solution.

Detachment of the semiconductor layer in a manner particularly insusceptible to breaking is achieved as a result.

The detaching unit according to the invention is preferably configured for carrying out the method according to the invention, in particular one advantageous embodiment thereof.

A particularly cost-effective method configuration arises in one advantageous embodiment by virtue of the device for edge side correction and the detaching unit forming one structural unit, in particular being arranged in a common housing. It is thereby possible for the coated carrier substrate to be relayed between the devices in a manner insusceptible to faults and breaking.

Cost-effective production of the semiconductor layer is made possible in particular by a device for producing a semiconductor layer. The device comprises a depositing apparatus for depositing the semiconductor layer on a separating layer on a carrier substrate. What is essential is that the device comprises a device for the edge side correction of a coated carrier substrate. The advantages mentioned above are achieved as a result. With further preference, the device comprises a detaching unit as described above in order to further reduce the risk of breaking during detachment of the semiconductor layer.

The device according to the invention for producing a semiconductor layer is preferably configured for carrying out the method according to the invention, in particular one advantageous embodiment thereof.

BRIEF DESCRIPTION OF THE DRAWINGS

Further advantageous features and configurations are explained below on the basis of exemplary embodiments and the figures, in which.

DETAILED DESCRIPTION OF THE PREFERRED EMBODIMENTS

All of the figures are schematic illustrations that are not true to scale. In the figures, identical reference signs designate identical or identically acting elements. In FIGS. 1, 2A-2E, and 3A-3E, a processing side of a carrier substrate 1 is always situated at the top.

Figure 1:
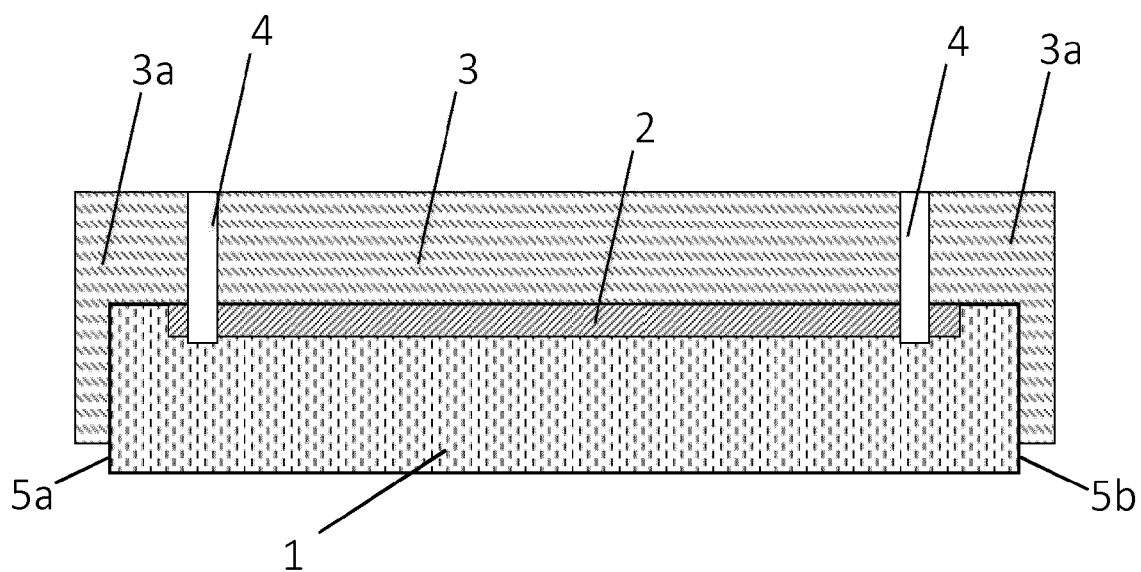
FIG. 1 shows a method for producing a semiconductor layer according to the prior art.

FIG. 1 illustrates a method for producing a semiconductor layer according to the prior art:

A porous separating layer 2 was formed at a carrier substrate 1. A semiconductor layer 3 was subsequently deposited epitaxially at the processing side, situated at the top in FIG. 1. This semiconductor layer covers the entire processing side, i.e. both regions having a separating layer and edge regions not having a separating layer. Furthermore, due to parasitic deposition, the semiconductor layer 3 may at least partly overlap edge sides (5a and 5b) of the carrier substrate, as illustrated in FIG. 1. Afterward, separating cuts 4 that completely penetrate through at least the semiconductor layer 3 are carried out by laser radiation. The semiconductor layer 3 lying between the separating cuts 4 is removed.

This results in the disadvantage already described in the introduction that at the edges regions 3a of the semiconductor layer remain on the carrier substrate, which regions are arranged in particular partly directly at the carrier substrate 1 and can thus be removed only with difficulty.

Figure 2A:
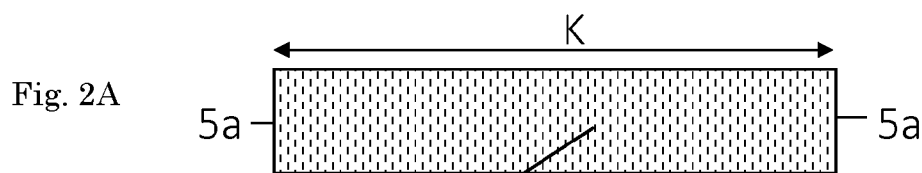
FIGS. 2A-2E shows a first exemplary embodiment of a method for producing a semiconductor layer.

FIGS. 2A-2E illustrate a first exemplary embodiment of a method according to the invention:

In accordance with FIG. 2A, a carrier substrate 1 is provided. In the present case, the carrier substrate 1 is embodied as a p-doped silicon substrate having a thickness of 600 μm and a doping of $1 \times 10^{18}$ cm$^{-3}$ to $5 \times 10^{18}$ cm$^{-3}$, in the present case $3 \times 10^{18}$ cm$^{-3}$. The carrier substrate has a square basic area having an edge length of preferably between 10 cm and 20 cm, in the present case 156 mm.

A porous separating layer 2 is formed at a processing side of the carrier substrate 1, said processing side being situated at the top. The separating layer has a thickness of up to 3 μm, in the present case approximately 2 μm. Forming the porous separating layer 2 at the carrier substrate 1 is carried out by means of etching and can be carried out for example as described in DE 10 2013 219 886. The method described enables the separating layer to be formed over the whole area on the processing side of the substrate.

Figure 2B:
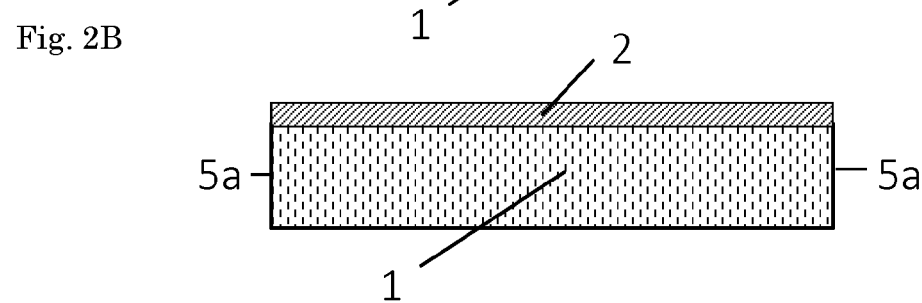

The result illustrated in FIG. 2B thus corresponds to the state after method step A described above, wherein the separating layer 2 has been produced in a manner covering the processing side of the carrier substrate 1 over the whole area.

In a method step B, as described above, a semiconductor layer 3 is applied at the processing side by means of vapor deposition, in the present case epitaxy. The semiconductor layer can be applied epitaxially for example in principle as described in WO 2013/004851 A1.

What is essential is that in said method step B the semiconductor layer 3 is applied in a manner covering the separating layer 2 at least at the processing side over the whole area and in a manner at least partly overlapping one or more edge sides 5a of the carrier substrate 1.

Figure 2C:
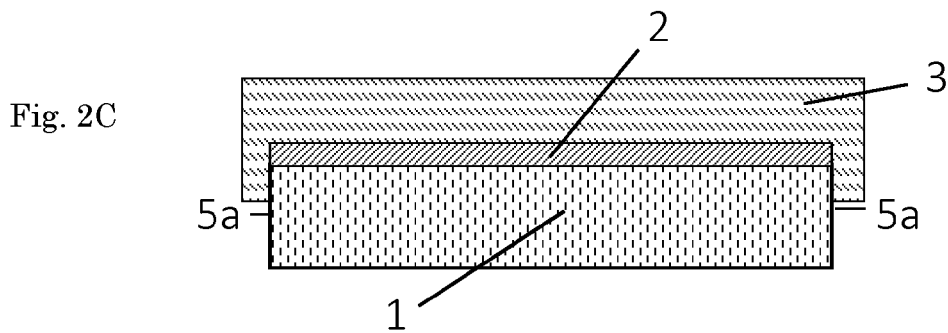

The result is illustrated in FIG. 2C: the semiconductor layer 3 overlaps the edge sides 5a of the carrier substrate 1 partly by virtue of its extending over approximately two thirds of the thickness of the carrier substrate 1. In the present case, the semiconductor layer 3 circumferentially covers all four edge sides of the carrier substrate 1a, with the result that a whole-area covering of the separating layer 2 and thus a whole-area covering of the processing side by the semiconductor layer 3 are ensured with a high fault tolerance.

What is furthermore essential is that between method step B described above and a process that follows later of detaching the semiconductor layer 3 from the carrier substrate 1, in a method step C0, regions of the semiconductor layer 3 which overlap an edge side are removed.

Figure 2D:
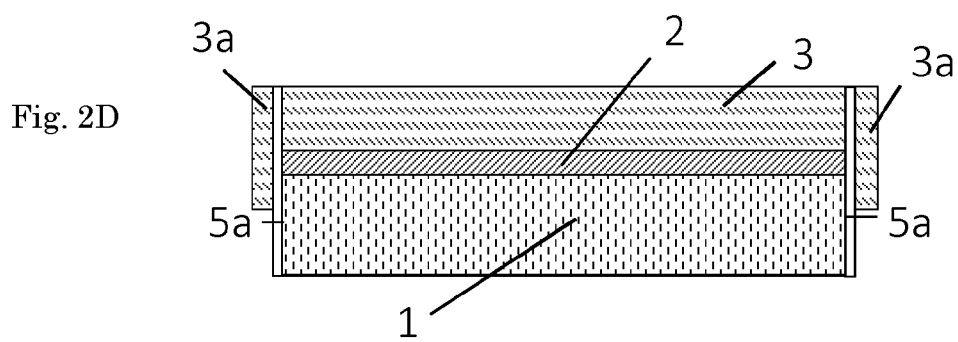

As evident in FIG. 2D, separating cuts 4 are carried out by wafer saws in such a way that regions 3a of the semiconductor layer 3 which overlap edge sides 5a, 5b of the carrier substrate 1 are removed. In this case, the separating cuts completely penetrate through the semiconductor layer 3. Consequently, after the separating cuts 4 have been made, the regions 3a are mechanically no longer connected to the carrier substrate 1 and the remaining semiconductor layer 3 and thus drop off.

Figure 2E:
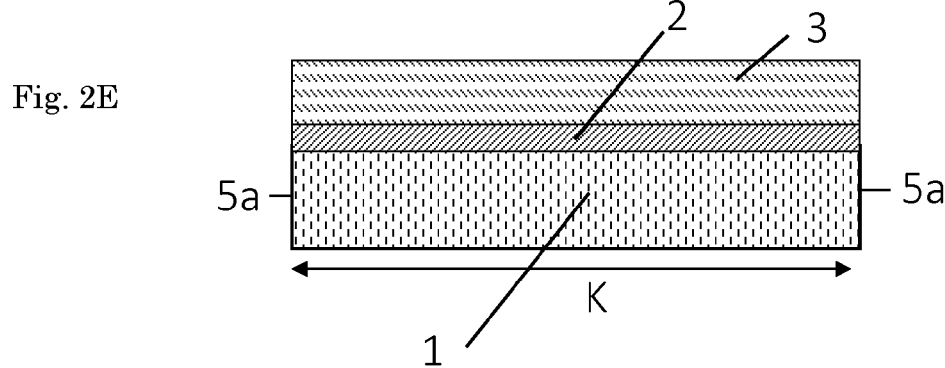

The result is illustrated in FIG. 2E:

In this method stage, therefore, a layer system comprising carrier substrate 1, separating layer 2 and semiconductor layer 3 has been produced, wherein both the separating layer 2 and the semiconductor layer 3 cover the processing side of the carrier substrate 1 over the whole area and wherein the original lateral extent of the carrier substrate 1 has been preserved within the permissible tolerances and thus also corresponds to the lateral extent of the separating layer 2 and the semiconductor layer 3. The original edge length K of 156 mm (see FIG. 2A) of the carrier substrate 1 thus also corresponds to the edge length K in the method stage in accordance with FIG. 2E since excess material has been removed at the edge sides of the carrier substrate. Accordingly, the semiconductor layer 3 also has an edge length K of 156 mm.

Afterward, detaching the semiconductor layer from the carrier substrate is carried out in a method step C.

The detaching is carried out by mechanical force action by virtue of the two semiconductor layers being separated from one another by means of grippers, which in the present case operate by the principle of vacuum suction.

FIG. 3 illustrates a second exemplary embodiment of a method according to the invention. In order to avoid repetition, only the essential differences with respect to the method in accordance with FIGS. 2A to 2E will be discussed below.

Figure 3A:
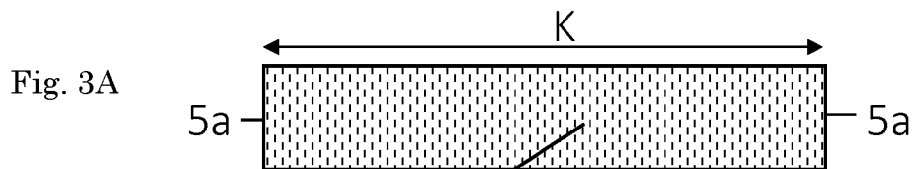
FIGS. 3A-3E shows a second exemplary embodiment of a method for producing a semiconductor layer.
Figure 3B:
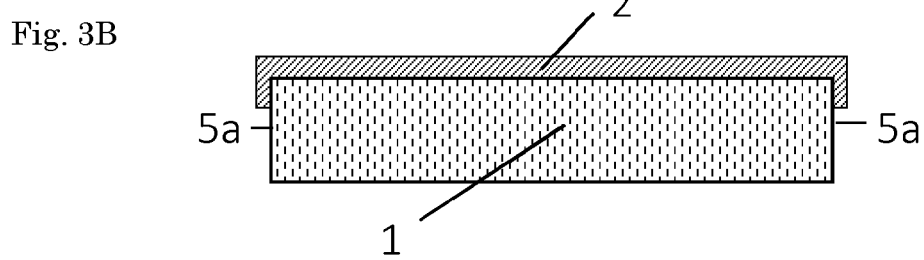

The carrier substrate 1 made available in accordance with FIG. 3A is likewise provided with a separating layer 2 over the whole area at the processing side. In this exemplary embodiment, for this purpose the carrier substrate 1 is covered with silicon nitride powder and a separating layer 2 is thereby formed which, in a manner governed by the process, partly overlaps the edge sides 5a of the carrier substrate 1. Alternatively, here as well the separating layer could be produced by porosification as described with regard to FIG. 2, wherein the separating layer is produced in the carrier substrate in a manner partly overlapping the edge sides.

Figure 3C:
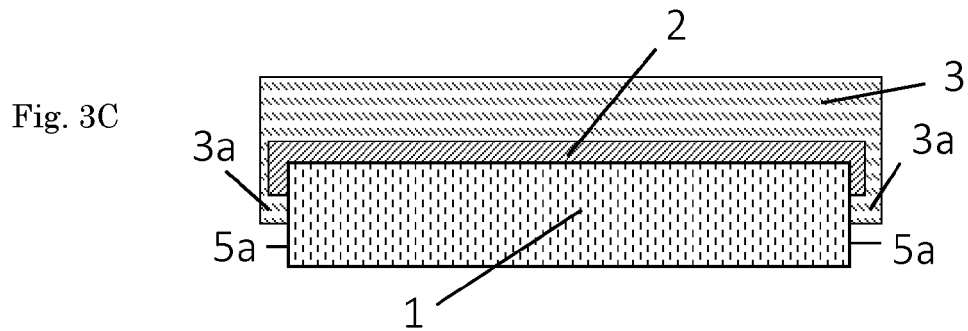

In the method stage illustrated in FIG. 3C, in which method stage the semiconductor layer 3 has been applied by vapor deposition, the semiconductor layer 3 thus covers the separating layer 2 over the whole area and overlaps the edge sides 5a of the carrier substrate 1. In the overlap regions at the edge sides 5a of the carrier substrate 1, the semiconductor layer 3 in this case thus partly directly adjoins the separating layer 2 (in the upper regions of the edge sides 5a) and partly directly adjoins the carrier substrate 1 (in the central regions of the edge sides 5a).

In this way, a whole-area covering of the processing side of the carrier substrate 1 by the separating layer 2 is additionally afforded with high fault tolerance.

Figure 3D:
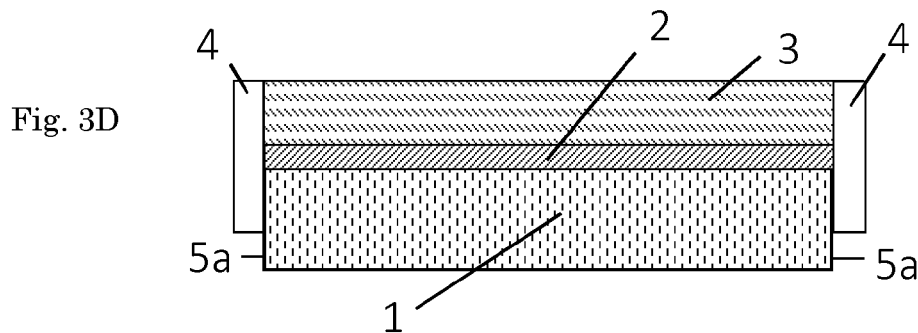

As illustrated in the subfigure in FIG. 3D, both regions of the semiconductor layer 3 and regions of the separating layer 2 which overlap edge sides 5a of the carrier substrate 1 are subsequently removed. In this exemplary embodiment, for this purpose separating cuts 4 are made by laser radiation. The separating cuts 4 have a width which is greater than or at least equal to the thickness of the overlapping layers at the edge sides 5a. In this case, the material at the removal regions, i.e. at the separating cuts 4, is thus completely melted.

Alternatively, by use of other methods, for example by wafer saws, the material can be completely removed by machining in the region of the separating cuts 4, in particular by using saw blades having a thickness which is at least equal to, preferably greater than, the thickness of the layers to be removed at the edge sides 5a.

Figure 3E:
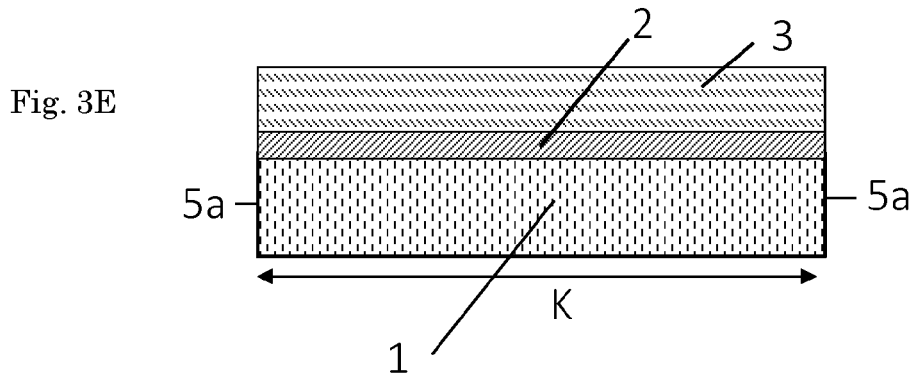

The result in accordance with FIG. 3E corresponds to the result in accordance with FIG. 2E. In particular, in this exemplary embodiment, too, the edge length of the carrier substrate 1 in the method stage in accordance with FIG. 3E is equal to the original edge length as in the method stage in accordance with FIG. 3A.

Here, too, detaching the semiconductor layer 3 is subsequently carried out. For this purpose, in the case of the second exemplary embodiment, firstly ultrasound is applied to the entire layer system. The separating layer 2 is mechanically significantly more unstable, compared with the semiconductor layer 3 and the carrier substrate 1. The ultrasound thus leads to an additional mechanical weakening of the separating layer 2, such that mechanical detaching of the semiconductor layer 3 can subsequently be carried out by means of less force action and thus also with a reduced risk of breaking.

Figure 4:
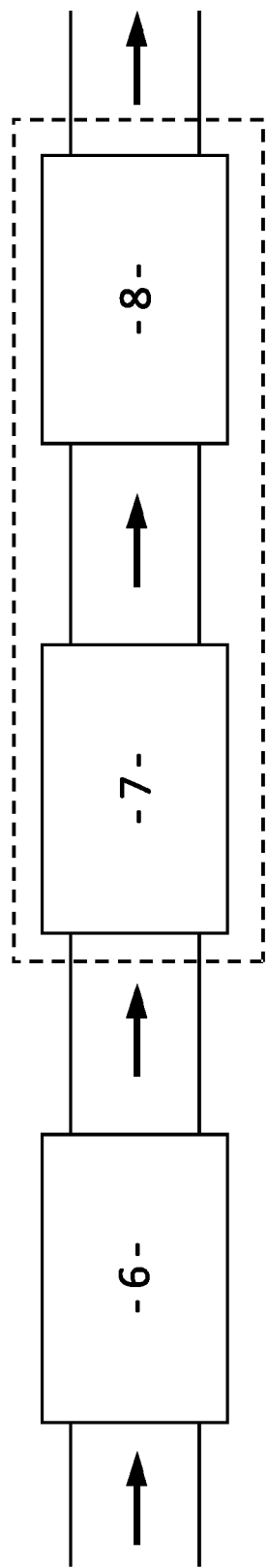
FIG. 4 shows a device for producing a semiconductor wafer.

FIG. 4 schematically illustrates a device according to the invention for producing a semiconductor wafer. The device comprises a coating unit 6 for epitaxially coating a carrier substrate with a semiconductor layer, a device for edge side correction 7, which will be explained in greater detail below with reference to FIG. 5, and a detaching unit 8, which will be explained in greater detail below with reference to FIG. 6.

In this case, the coating unit 6 forms one structural unit. Likewise, as indicated by the dashed line, the device for edge side correction 7 and the detaching unit 8 form one structural unit; in particular, device for edge side correction and detaching unit are arranged in a common housing.

Prepared carrier substrates 1 are fed into the device, said carrier substrates already having a separating layer over the whole area at least at a processing side. The coating unit 6 can be embodied as explained in WO 2012/084187, in particular FIG. 5 and the associated description.

The carrier substrates coated with the semiconductor layer are fed to the device for edge side correction 7 and then to the detaching unit 8. In the detaching unit 8, the semiconductor layer is in each case separated from the carrier substrate, wherein the semiconductor layer constitutes the work result, i.e. the silicon wafer for producing electronic components, in particular producing photovoltaic solar cells.

The carrier substrate is cleaned; in particular, the processing side is cleaned by etching. The carrier substrate can then be reused by virtue of a separating layer once again being formed at least over the whole area at the processing side and the carrier substrate in turn being introduced into the device in accordance with FIG. 4.

Figure 5:
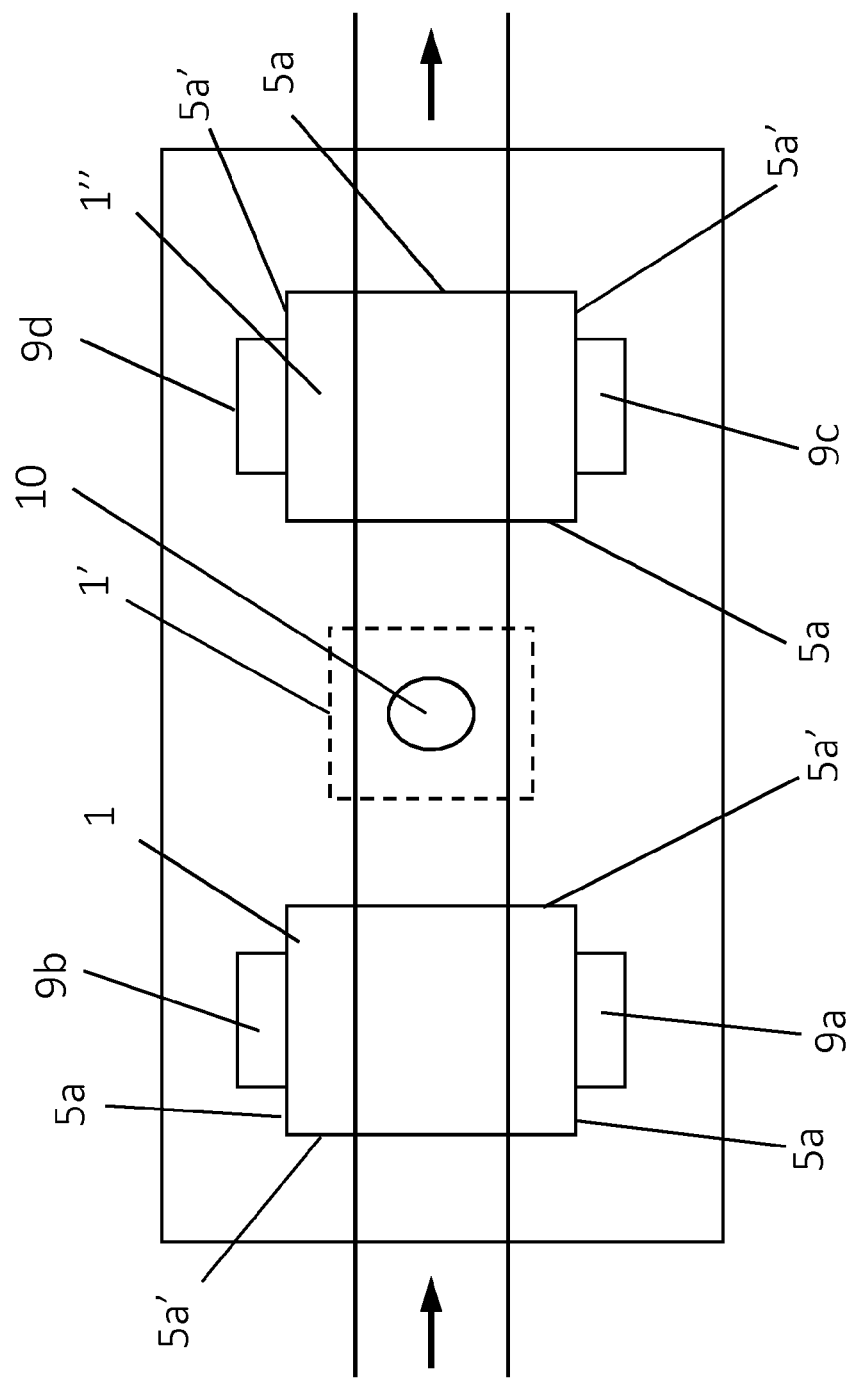
FIG. 5 shows a detail view of a device for edge side correction from the device in accordance with FIG. 4.

FIG. 5 shows a schematic illustration of the device for edge side correction 7 in a plan view from above. Carrier substrates coated with a semiconductor layer are fed in from the left, wherein in the present case the semiconductor layer 3 is arranged at the top, i.e. the plan view in accordance with FIG. 5 from above shows the semiconductor layer 3, the edges 5a and 5a' of which correspond, however, both to the edges of the separating layer 2 situated underneath, and to the edges of the carrier substrate 1 situated underneath.

The device for edge side correction 7 comprises a first removing apparatus having two removing devices 9a and 9b and a second removing apparatus having two removing devices 9c and 9d. All four removing devices 9a to 9d are embodied in each case as a saw, in particular as a circular saw.

As is evident in FIG. 5, the removing devices 9a to 9d are respectively arranged in pairs opposite one another, wherein the distance between the removing means corresponds to the edge length of the carrier substrate 1. In the present case, the removing devices are stationary and the carrier substrate is moved through relative to the removing devices between them from left to right. Upon the carrier substrate 1 being guided through the removing devices 9a and 9b of the first removing apparatus, material is thus removed at edge sides 5a of the carrier substrate 1, that is to say that at said edge sides 5a regions of the semiconductor layer and, if appropriate, of the separating layer which overlap said edge sides 5a are removed.

In the processing direction, the carrier substrate 1 is then fed to a rotating device 10. The latter comprises a height-movable ram having suction openings for securing the carrier substrate by suction. When the carrier substrate is situated in the position 1' illustrated by dashed lines, the ram 10 is moved upward (out of the plane of the drawing in FIG. 5 and thus lifts off the carrier substrate from a conveyor for guiding the carrier substrate through the device 7, the carrier substrate simultaneously being fixed to the ram 10 by suction. The ram 10 is furthermore embodied such that it is rotatable by motor and carries out a rotation by 90°.

After this rotation, edge sides 5a which previously were oriented parallel to the direction of movement of the carrier substrate thus lie perpendicular to the direction of movement, and edge sides 5a' of the carrier substrate 1 which were previously oriented perpendicular to the direction of movement now correspondingly lie parallel to the direction of movement.

Afterward, the carrier substrate 1 is conveyed to the second removing apparatus having the removing devices 9c and 9d. An edge correction is thus carried out here in the same way by removal of material at the edge sides of the carrier substrate 1. Due to the rotation effected previously, material is now removed at the two remaining edge sides 5a'.

As a result, an edge side correction was thus carried out at all four edge sides 5a and 5a' of the carrier substrate 1.

Figure 6:
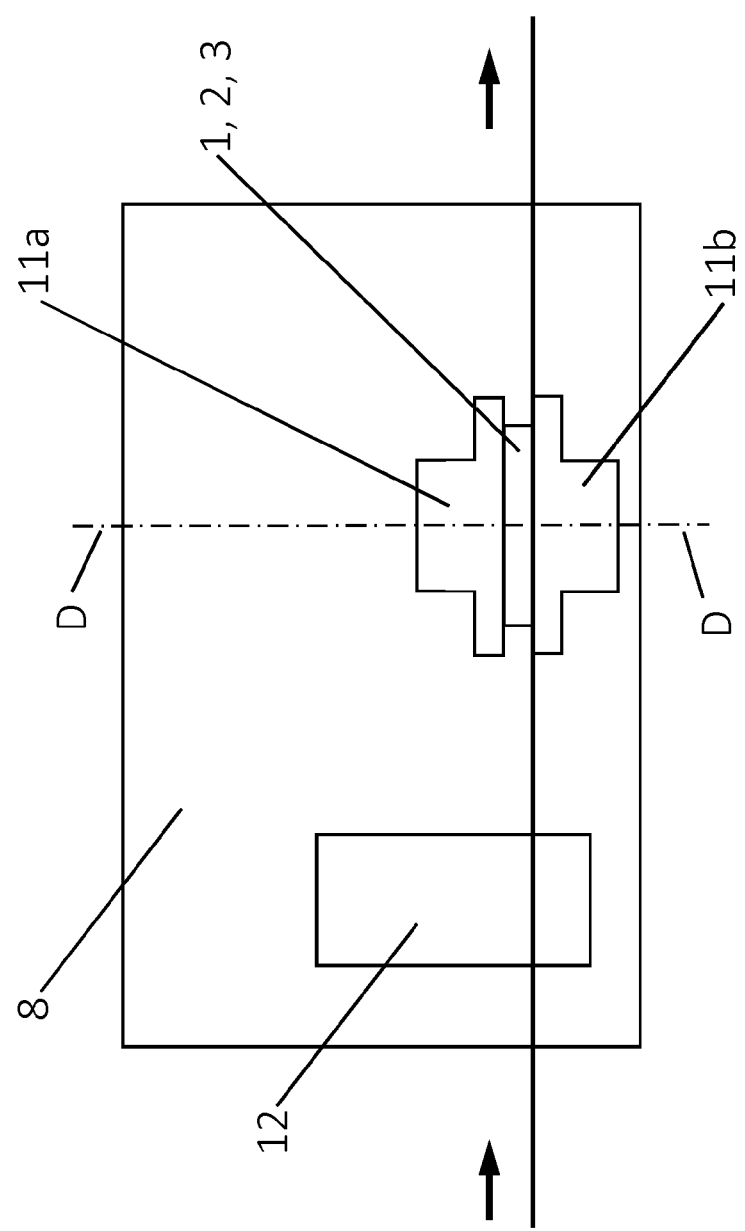
FIG. 6 shows a detail view of a detaching unit of the device in accordance with FIG. 4.

FIG. 6 illustrates the detaching unit 8 for detaching the semiconductor layer from the carrier substrate in side view. For this purpose, a carrier substrate 1 is conveyed into a detachment position between two vacuum rams 11a and 11b. In this case, the vacuum ram 11b engages on the underside of the carrier substrate 1 and the vacuum ram 11a engages on the processing side, i.e. on the top side of the semiconductor layer 3. Via vacuum openings, the carrier substrate 1 is fixed to the vacuum ram 11b and the semiconductor layer 3 is fixed to the vacuum ram 11a. Afterward, the vacuum ram 11a is moved upward and the semiconductor layer 3 is therefore separated from the carrier substrate 1.

In this exemplary embodiment, an ultrasonic unit 12 is disposed upstream of the vacuum ram. By use of said ultrasonic unit 12, before the detachment process, ultrasound having e.g. the frequency of 25 kHz and an electrical power of 600 W is applied to the layer system comprising carrier substrate 1, separating layer 2 and semiconductor layer 3, with the result that the separating layer 2 is weakened vis à vis its mechanical stability.

In an alternative exemplary embodiment, a thermal shock unit is arranged instead of the ultrasonic unit 12, which thermal shock unit brings about heating of the carrier substrate by a laser and cooling down of the semiconductor layer 3 by water jet cooling. Due to the different expansion, mechanical loading of the separating layer 2 is effected, which is thereby weakened vis à vis the mechanical stability.

In a further alternative exemplary embodiment, an etching unit is arranged instead of the ultrasonic unit 12, which etching unit weakens or almost completely removes the residual adhesion sites of the separating layer by immersion of the layer system comprising carrier substrate 1, separating layer 2 and semiconductor layer 3 into e.g. a mixture comprising hydrofluoric acid and nitric acid or boiling phosphoric acid.

In a further alternative exemplary embodiment, the ultrasonic unit 12 is dispensed with. In this exemplary embodiment, the vacuum rams 11a and 11b are embodied as rotatable about a common rotation axis D. In this exemplary embodiment, for detachment purposes, firstly the carrier substrate 1 is fixed to the vacuum ram 11b and the semiconductor layer 3 is fixed to the vacuum ram 11a as described above. Afterward, vacuum ram 11a and vacuum ram 11b are rotated in opposite senses with respect to one another about the rotation axis D, in the present case by an angle of 0.5°. This results in mechanical loading in particular of the separating layer 2, which is thus weakened vis à vis its mechanical stability.

It likewise lies within the scope of the invention to combine a plurality of the abovementioned elements of rotating device, tilting device, ultrasonic device, thermal shock unit and etching unit.

The invention claimed is:

1. A method for producing a semiconductor layer (3), comprising the following steps:
    A producing a separating layer (2) at a carrier substrate (1);
    B applying a semiconductor layer (3) on the separating layer (2);
    C detaching the semiconductor layer (3) from the carrier substrate;
    wherein
    in method step A the separating layer (2) is produced in a manner covering at least a processing side of the carrier substrate over a whole area,
    in method step B the semiconductor layer (3) is applied in a manner covering the separating layer (2) at least at the processing side over the whole area and in a manner at least partly overlapping one or more edge sides (5a, 5b) of the carrier substrate, and
    between method steps B and C, in a method step C0, removing regions of the semiconductor layer (3) which overlap the one or more edge sides.

2. The method as claimed in claim 1, further comprising in method step A producing the separating layer (2) in a manner at least partly extending along the one or more edge sides (5a, 5b) of the carrier substrate, and
    after method step B, in the method step C0, removing at least regions of the separating layer (2) which overlap the one or more edge side.

3. The method as claimed in claim 2, further comprising step B applying the semiconductor layer (3 applied in a manner at least partly covering the separating layer (2) at the one or more edge sides (5a, 5b).

4. The method of claim 3, wherein the semiconductor layer (3) is additionally applied in a manner directly covering the semiconductor substrate at least partly at the one or more edge sides (5a, 5b).

5. The method as claimed in claim 1, wherein the removing of the semiconductor layer (3) is carried out by one or more of the following:
    removing by laser radiation,
    water jet cutting,
    thermal shock-induced breaking,
    diamond blade wafer sawing,
    wire sawing,
    milling,
    plasma cutting, or
    ion beam cutting.

6. The method as claimed in claim 1, wherein the material to be removed at the one or more edge sides (5a, 5b) is completely removed by at least one of machining, ablating, evaporating or melting during the removing process.

7. The method as claimed in claim 1, wherein the carrier substrate (1) has a rectangular processing side, and
    in method step C0, in a method step C0a, removing is carried out simultaneously at two mutually opposite edge sides (5a, 5b) of the carrier substrate and, in a succeeding method step C0b, removing is carried out simultaneously at the other two opposite edge sides (5a, 5b) of the carrier substrate.

8. The method of claim 7, further comprising
rotating the carrier substrate by 90° about an axis perpendicular to the processing side between method steps C0a and C0b.

9. The method as claimed in claim 1, further comprising in method step C conducting a prior shearing movement or a simultaneous shearing movement with a pulling-off movement of the semiconductor layer (3), with a rotation angle of between 0.0001° and 10° for detaching the semiconductor layer (3) from the carrier substrate.

10. The method as claimed in claim 1, further comprising between method steps B and C, weakening the separating layer (2) by mechanical stress loading or chemical attack.

11. The method of claim 10, further comprising carrying out the weakening by at least one of a mechanical movement transversely with respect to the pulling-off direction, ultrasound, applying a temperature stress between the semiconductor layer and carrier substrate (1), or by a wet-chemical etchant.

12. The method as claimed in claim 1, wherein
the semiconductor layer (3) is configured as a silicon layer having a doping in a range of $1\times10^{14}$ cm$^{-3}$ to $1\times10^{19}$ cm$^{-3}$.

13. The method as claimed in claim 1, wherein
the carrier substrate (1) is a p-doped semiconductor substrate having a doping of greater than $1\times10^{16}$ cm$^{-3}$.

14. A semiconductor wafer produced by a method as claimed in claim 1,
wherein the semiconductor wafer is the detached semiconductor layer (3).

* * * * *